United States Patent
Drogi

[19]

[11] Patent Number: 5,877,643
[45] Date of Patent: *Mar. 2, 1999

[54] PHASE SHIFT AMPLIFIER AND ITS APPLICATIONS TO A RECOMBINING CIRCUIT

[75] Inventor: Serge Drogi, Caen, France

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 916,748

[22] Filed: Aug. 19, 1997

Related U.S. Application Data

[63] Continuation of Ser. No. 597,374, Feb. 8, 1996, abandoned, which is a continuation of Ser. No. 355,465, Dec. 14, 1994, abandoned.

[30] Foreign Application Priority Data

Dec. 22, 1993 [FR] France .................................. 93 15461

[51] Int. Cl.⁶ ....................................................... H03K 3/00
[52] U.S. Cl. ........................... 327/256; 327/252; 327/359
[58] Field of Search ..................................... 327/231, 232, 327/233, 234, 238, 240, 242, 245, 250, 254, 256, 260, 252, 258, 355, 356, 357, 359; 330/261, 294, 252, 109, 110

[56] References Cited

U.S. PATENT DOCUMENTS

| | | | |
|---|---|---|---|
| 3,290,605 | 12/1966 | Humphrey | 327/256 |
| 4,122,364 | 10/1978 | Yano | 327/246 |
| 4,547,744 | 10/1985 | Kasperkovitz | 330/261 |
| 4,553,876 | 11/1985 | Haque et al. | 330/253 |
| 4,663,594 | 5/1987 | Perkins | 327/240 |
| 4,866,397 | 9/1989 | Kimyacioglu | 330/252 |
| 5,148,062 | 9/1992 | Goldfarb | 327/237 |
| 5,345,346 | 9/1994 | Brannon et al. | 360/67 |

FOREIGN PATENT DOCUMENTS

| | | |
|---|---|---|
| 0302290 | 2/1989 | European Pat. Off. . |
| 9211704 | 7/1992 | WIPO . |

*Primary Examiner*—Kenneth B. Wells

[57] ABSTRACT

Phase shift amplifier formed by a differential pair of input transistors each collector of which transistors is connected to a respective phase shift resistor and to a phase shift capacitor, whereas the other ends of each phase shift resistor form nodes A and B respectively, while the other ends of the phase shift capacitors are connected in a cross-coupling. According to the invention, the nodes A and B are connected to the input of amplifiers of the transimpedance type at the output of which amplifiers a differential signal is available which is phase shifted relative to the differential input signal.

3 Claims, 2 Drawing Sheets

PHASE SHIFT AMPLIFIER AND ITS APPLICATIONS TO A RECOMBINING CIRCUIT

This is a continuation of application Ser. No. 08/597,374, filed on Feb. 8, 1996, which is a continuation of Ser. No. 08/355,465, filed on Dec. 14, 1994, both now abandoned.

BACKGROUND OF THE INVENTION

The invention relates to a phase shift amplifier comprising a first and a second transistor arranged to form a differential input pair supplied with steady current, these transistors each having a control electrode for receiving an input signal, and an output electrode, in which amplifier the output electrode of the first transistor is connected to a terminal of a first phase shift resistor and also to a terminal of a first phase shift capacitor, the output electrode of the second transistor is connected to a terminal of a second phase shift resistor and also to a terminal of a second phase shift capacitor, the second terminal of the first phase shift resistor is connected to the second terminal of the second phase shift capacitor at a first node, and the second terminal of the second phase shift resistor is connected to the second terminal of the first phase shift capacitor at a second node.

The invention likewise relates to a recombining circuit which effects for either one of the two differential input signals which are phase shifted relative to each other, an amplification and a summation of these signals after a complementary phase shift, one of the input signals presenting a first component of a given phase and the other input signal presenting a second component which has a quadrature phase relationship to the first component.

Phase shift amplifiers are used nowadays in numerous applications and, more particularly, in the field of radio frequency transmissions. A typical application consists of producing two signals which are quadrature signals in view of their transmission coding. A second particularly important example of the use of phase shift amplifiers with respect to reception comprises the realization of a mixer in which two phase shift amplifiers are used which allow, when the quadrature phase shift is ideally adhered to, the elimination of the image frequency in a superheterodyne receiver.

A phase shift amplifier of the type defined in the opening paragraph is known from document WO-A-9211704 where it is described more particularly with reference to FIG. 2 of that document. The known phase shift amplifier utilizes networks of the series arranged RC type connected in parallel between the output electrodes of the transistors of the input stage. This amplifier operates, in essence, with a voltage because circuits of phase shift resistors-phase shift capacitors produce at their junctions a signal in the form of an output voltage signal, so that a high input impedance should be used.

In effect, the impedance used affects the phase shift of the output signals when it is not large relative to the impedance of the elements of the RC network. This indicates a serious drawback from the point of view of current consumption. In effect, to maintain a high signal-to-noise ratio at the output of the phase shift amplifier, it is necessary to supply this amplifier with a relatively large current. But at the output of the phase shift amplifier, a power amplifier is necessary which is also to be supplied with a large current for the same reason.

SUMMARY OF THE INVENTION

The invention proposes to eliminate this drawback by providing a high-performance phase shift amplifier with respect to the signal-to-noise ratio, in which a further power amplification is saved and accordingly the consumption of supply current is reduced.

The invention is based on the concept of making the phase shift network of the RC type operate in an admittance mode rather than in an impedance mode, the admittance mode producing a power signal output rather than a voltage signal output.

In effect, according to the present invention, a phase shift amplifier of the type defined in the opening paragraph is characterized in that the first node is connected to the input of an amplifier of the transimpedance type and the second node is connected to the input of a second amplifier of the transimpedance type, which amplifiers produce a differential output signal shifted in phase relative to the input signal.

A differential signal, shifted in phase relative to the input signal, appears at the output of the transimpedance amplifiers. This signal can then be used with an impedance of which the value does not exert any influence on the value of the phase shift of these signals. The phase shift amplifier according to the invention presents the advantage of a relatively low output impedance which allows a high-performance output from the point of view of the signal-to-noise ratio while the losses in the RC networks (phase shift resistance, phase shift capacitance) are very low. Thus, the power of the amplified signal is available at the output, without the necessity of using an additional power amplifier stage. The result is a corresponding efficient use with respect to the circuitry and the supply current consumption.

According to an embodiment preferred for its simplicity, the phase shift amplifier is characterized in that the amplifiers of the transimpedance type are formed by a cascoded stage formed by a third and a fourth transistor, the output electrodes of which transistors being coupled to a first and to a second load resistor respectively, and the control electrodes of which transistors receiving a reference voltage.

To allow a phase adjustment of the output signals, a variant of the embodiment according to the invention is characterized in that the phase shift amplifier comprises at least an additional phase shift resistor being connected in parallel with the phase shift resistor by means of an electronic switch.

Advantageously, the first, second, third and fourth transistors are bipolar transistors, whereas said electronic switch is formed by a MOS-type field effect transistor.

As will be explained in more detail hereinafter, the calculation of the phase shift of a signal having a given frequency is sufficiently simple, so that the values of the additional phase shift resistors can easily be provided, which makes it possible to obtain at the output a given phase shift (for example by 90°) relative to the input signal, in response to various frequencies of the input signal.

A particularly advantageous application of the phase shift amplifier according to the invention relates to a recombining circuit which effects for either one of the two differential input signals, phase shifted relative to each other, an amplification and a summation of these signals after a complementary phase shift, one of the input signals presenting a first given phase component and the other input signal presenting a second signal component having a quadrature phase relationship to the first component, characterized in that the circuit is formed by two phase shift amplifiers as defined above.

Such a recombining circuit is particularly suitable for receiving current input signals and produces on its output power output signals which present a high-performance signal-to-noise ratio without the need of providing an additional amplifier stage as is the case in a known recombining circuit.

BRIEF DESCRIPTION OF THE DRAWINGS

The following description relating to the appended drawings given by way of non-limiting examples, will more clearly describe the invention.

FIG. 2 is a block diagram of a known phase shift circuit, whereas

DETAILED DESCRIPTION OF THE PREFERRED EMBODIMENTS

Figure 1:
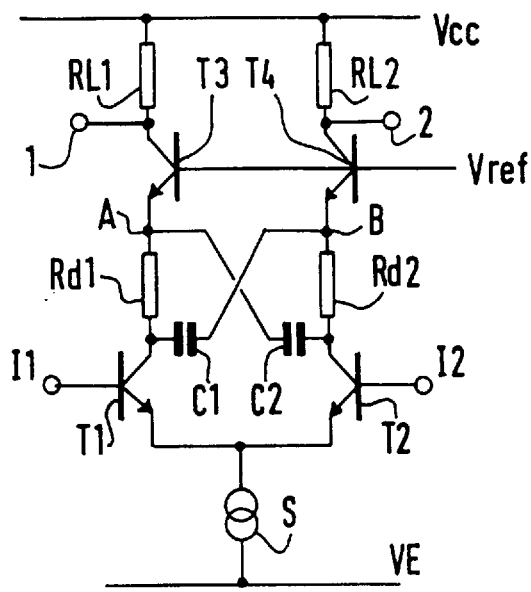
FIG. 1 shows the electrical circuit diagram of a phase shift amplifier according to the invention.

The phase shift amplifier shown in FIG. 1 comprises a differential pair of NPN-type bipolar transistors formed by a first transistor T1 and a second transistor T2 supplied with steady current by a current source S which is connected, on the one hand, to the combined emitters of the transistors T1 and T2 and, on the other hand, to a negative supply terminal VE of the amplifier. The base of transistor T1 receives an input signal I1, whereas the base of transistor T2 receives an input signal I2, the complement of signal I1. The collector of transistor T1 is connected, on the one hand, to a first phase shift resistor Rd1 and, on the other hand, to a first phase shift capacitor C1. Similarly, the collector of transistor T2 is connected, on the one hand, to a second phase shift resistor Rd2 and, on the other hand, to a second phase shift capacitor C2. The second terminal of the phase shift resistor Rd1 forms a node A and the second terminal of the phase shift resistor Rd2 forms a node B, which nodes are connected in a cross-coupling to the second terminals of the phase shift capacitors C1 and C2. A first load resistor RL1 is coupled to node A and a second load resistor RL2 is coupled to node B via a cascoded stage formed by a third transistor T3 and a fourth transistor T4 of the NPN type, the bases of which transistors are interconnected and receive a reference voltage Vref, the emitter of transistor T3 being connected to node A, its collector being connected to the first load resistor RL1 and the emitter of transistor T4 being connected to node B and its collector being connected to the second load resistor RL2. The resistors RL1 and RL2 are coupled to a positive supply terminal Vcc.

The voltage on the nodes A and B is practically fixed because it is determined by the voltage Vref minus the voltage of the base-emitter junction of the relevant transistor of the cascoded stage. The impedance seen from node A in the direction of load resistor RL1 may be made very low relative to the first phase shift resistor Rd1 by the choice of the current supplied by current source S. The same holds for the impedance seen from node B in the direction of the second load resistor RL2.

Thus, the cascoded stage T3, T4 comprising load resistors RL1 and RL2 forms an amplifier of the transimpedance type, very simplified here, because, in essence, it is current signals that are transmitted to the load resistors RL1 and RL2 and that develop an output voltage. In effect, a first output terminal 1 of the amplifier is connected to the node that connects the collector of transistor T3 to load resistor RL1 whilst a second output terminal 2 is connected to the node that connects the collector of transistor T4 to load resistor RL2.

It will be evident that the phase shift amplifier thus described has the property of producing a differential output signal on the terminals 1 and 2 which is an AC power signal. The input impedance of a user circuit connected to the output terminals 1 and 2 does not affect the phase shift value obtained with the output signals on these terminals. This property of the amplifier shown is particularly advantageous from the point of view of noise of the output signal. The noise can easily be optimized in response to circuit parameters, more specifically, the current supplied by the current source S.

A more detailed analysis of the operation of the phase shift amplifier according to the invention and a comparison with a known phase shift circuit will now be made with the aid of FIGS. 2 and 3.

Figure 2:
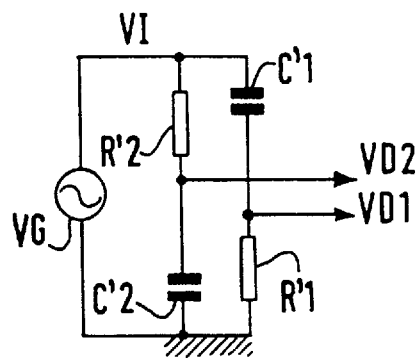

FIG. 2 shows the principle of a known phase shift circuit. A generator VG produces a voltage signal VI relative to earth, which is applied to two parallel branches, the first branch comprising in succession a phase shift capacitor C'1 and a phase shift resistor R'1 and the second branch comprising in succession a phase shift resistor R'2 and a phase shift capacitor C'2. In either one of the two branches the phase shift network is thus of a series-arranged RC type. Output voltages VD1 and VD2 are tapped from the intermediate points of the elements in each branch. A circuit of this type has a major drawback in that the output signals VD1 and VD2, phase shifted relative to each other, need a power amplification with a high input impedance as otherwise the phase shift of these signals would be disturbed. From the point of view of the signal-to-noise ratio, which is endeavoured to be kept as high as possible, there is thus a necessity to provide relatively low impedances in the phase shift circuit which implies the use of relatively large currents. But to maintain this signal-to-noise ratio within the required limits a power amplifier which also has a large power consumption is to be added at the output.

Figure 3:
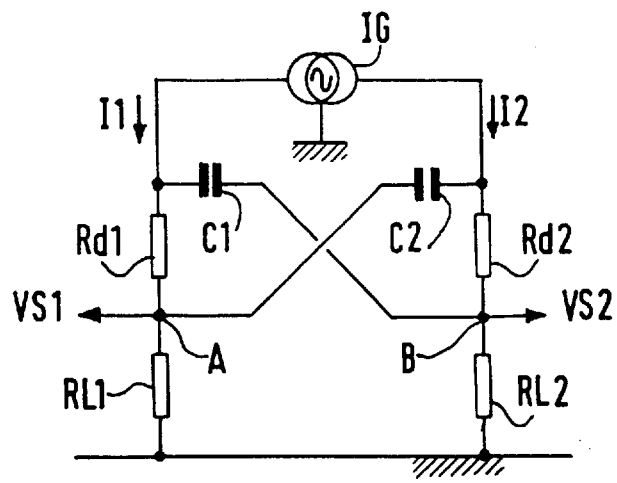
FIG. 3 shows, compared with FIG. 2, a basic circuit diagram of the phase shift circuit according to the invention.

In contrast, according to FIG. 3 a signal generator IG produces relative to earth two complementary signals I1, I2 which are now, in essence, current signals. Signal I1 is produced in a phase shift resistor Rd1 and also in a phase shift capacitor C1, the resistor Rd1 further being connected to a node A. The signal I2 is produced in a phase shift resistor Rd2 and also in a phase shift capacitor C2, the resistor Rd2 being further connected to node B. Between node A and earth, on the one hand, and between node B and earth, on the other, are inserted load resistors RL1 and RL2. The capacitors C1 and C2 are connected in a cross-coupling between the resistor terminals Rd1 and Rd2. Thus, the circuit of FIG. 3 resumes the principle of the phase shift amplifier described with respect to FIG. 1. Ideally, the load resistors RL1 and RL2 should have a zero value. In practice, it is sufficient for the value of these load resistors to be much lower than the phase shift resistances Rd1 and Rd2. The output signals VS1 and VS2 appearing on the nodes A and B respectively, however, have as low voltage levels as the load resistors RL1 and RL2 are small. Referring again to the diagram of FIG. 1, this voltage restriction no longer exists because of the presence of the cascoded stage formed by the transistors T3 and T4.

Similarly the above is true when the cascoded stage is replaced by amplifiers of the transimpedance type, irrespective of their structure.

The voltage of the output signals on terminals 1 and 2 of the circuit shown in FIG. 1 can be amplified by selecting resistors RL1 and RL2 of such a high value as is desired which, however, is compatible with the current produced by the current source S, the Vcc value, and taken into account the expected swing of the differential input signal I1, I2.

It is widely known that the output signals VD1 and VD2 of the phase shifter of FIG. 2 present a mutual phase shift depending on the frequency, and values of phase shift resistors and phase shift capacitors, which phase shift may easily be determined provided that the signals are used with a practically infinite impedance or at any rate a very high impedance compared with the impedance of the elements of the RC networks.

In the phase shift circuit shown in FIG. 3 the output signals VS1 and VS2 continue to be each other's opposites and present an identical phase shift with respect to the phase of the input signals I1 and I2.

Via a conventional mathematical analysis there may be shown that the phase shift value ($\phi$) of the signals VS1 and VS2 with respect to I1 and I2 respectively, is equal to:

$$\phi = -2.\text{Arctg}(R.C.\omega)$$

when the value of the resistors Rd1 and Rd2, referenced R, is equal, the value of the capacitors C1 and C2, referenced C, is equal and in which expression $\omega = 2\pi F$, F is the frequency of the signal under consideration.

The phase shift amplifier according to the invention can be used in a great many applications. By way of example an application to the receiving part of a radio frequency communication apparatus will be briefly described with respect to FIG. 4.

Figure 4:
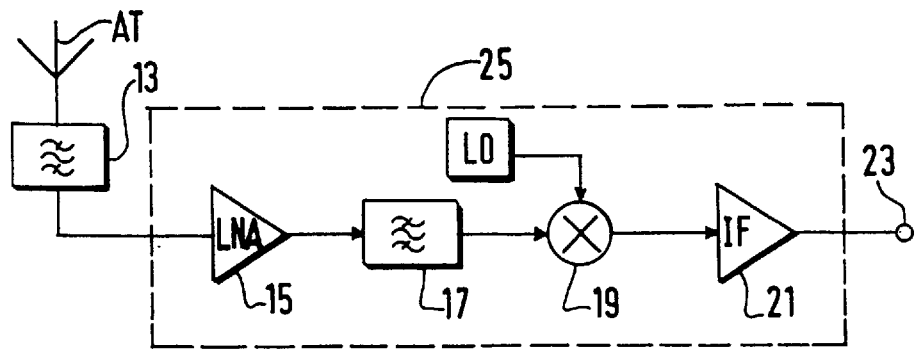
FIG. 4 shows a block diagram by which an application of the invention to a radio frequency receiving apparatus will be described.

FIG. 4 presents in a highly diagrammatic way part of the receiving path of a communication apparatus which conventionally comprises a first band-pass filter 13 which receives the aerial signals AT for a coarse selection of the receiving frequency band, a low noise amplifier 15 (LNA), and a second band-pass filter 17 by means of which a preselection of the receiving channel (channels) is performed by attenuating the image frequency as much as possible, that is to say, the frequency symmetrical with the receiving frequency with respect to the frequency of a local oscillator LO. The signal of this local oscillator LO is combined with the receiving signal by multiplication in a multiplier 19 at the output of which an intermediate frequency amplifier 21 (IF) is arranged.

For practical reasons and reasons of efficiency it is desirable to integrate in a same semiconductor circuit the part enclosed in the Figure in a dashed line box 25, that is to say, the low noise amplifier 15, the low-pass filter 17, the local oscillator LO, the multiplier circuit 19 and the intermediate frequency amplifier 21. Such an integrated circuit 25 thus receives the aerial signals after a first filter 13 and delivers an amplified intermediate frequency signal at the output terminal 23.

Considering the required highly particular characteristic features of passband filter 17, this filter is in most cases situated outside the integrated circuit 25, this filter then being formed, for example, according to a technique called surface wave technique which has the drawback of a high price and considerable cumbersomeness in the apparatus. A likely solution to being integrated consists of using another technique based on the summing of components of the signal to be filtered that are quadrature phase shifted. Such technique is known in principle and has already been proposed to effect the rejection of the image frequency which is symmetrical with the receiving frequency, with respect to the frequency of a local oscillator.

A rejection of the image frequency of this type is used, for example, in the circuit referenced UAA 2072M, marketed by PHILIPS.

However, this circuit implements the principle of the phase shift circuit described with respect to FIG. 2, which has the drawback of a large supply current consumption as this has already been explained, which consumption is all the more annoying when this circuit is intended to be used in a portable apparatus, which operates on batteries.

Figure 5:
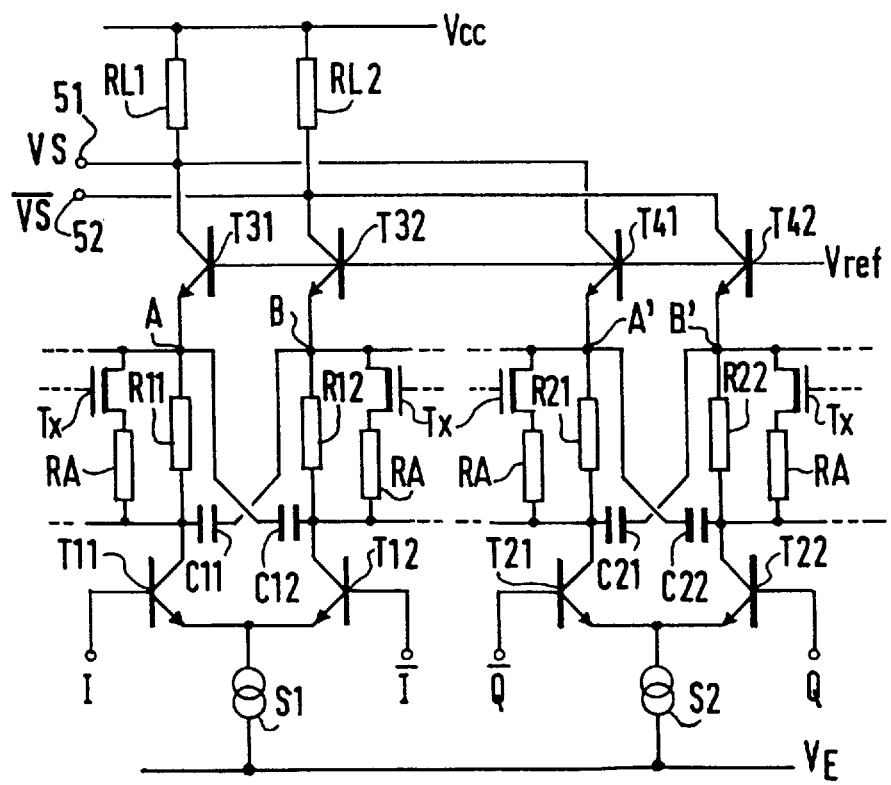
FIG. 5 shows the electric circuit diagram of a recombining circuit which uses two phase shift amplifiers according to the invention.

FIG. 5 shows the diagram of a recombining circuit which makes it possible to easily integrate the functions of circuit 25 of FIG. 4 with a saving on components and which circuit results in a substantial reduction of the necessary supply current.

One will easily recognize in FIG. 5 a first phase shift amplifier formed by the transistors T11, T12, the current source S1, the phase shift resistors R11, R12, the phase shift capacitors C11, C12, a cascoded stage formed by the transistors T31, T32, and two load resistors RL1 and RL2. A second phase shift amplifier is formed by input transistors T21, T22, the current source S2, phase shift resistors R21, R22, phase shift capacitors C21, C22, a pair of cascoded transistors T41, T42, the collector of these transistors being coupled to the same load resistors RL1, RL2, whilst the two phase shift amplifiers consequently effect a recombining of signals across these common resistors. The cascoded stages of the first and second phase shift amplifiers have their bases interconnected and connected to a reference potential Vref. To the differential pair of input transistors formed by transistors T11 and T12 are applied, respectively, a signal I and a signal $\bar{\text{I}}$. To the bases of the differential pair of input transistors formed by T21 and T22 are applied, respectively, the complementary signals $\bar{\text{Q}}$ and Q, whilst the signal Q is phase shifted through 90° relative to I and wherein I and Q are processed with respect to the input RF signal in order to make an image rejection in accordance with known techniques. The amplified and phase shifted current signal corresponding to the input signal I is applied to the load resistor RL1 as is the amplified and phase shifted signal corresponding to the input signal $\bar{\text{Q}}$. Analogously, the phase shifted and amplified signal corresponding to the input signal Q is applied to the load resistor RL2 as is the amplified and phase shifted current signal corresponding to the input signal $\bar{\text{I}}$.

The circuit shown in FIG. 5 thus carries out an amplification of the input signals and a recombination after a phase shift with two load resistors RL1 and RL2, which makes a differential output signal VS, $\overline{\text{VS}}$ appear on the terminals 51 and 52 connected to the load resistors RL1 and RL2. Obviously, it is evident that a reverse connection of the outputs of the phase shift amplifiers to the load resistors RL1 and RL2 is also possible and this as a function of the conditions of use.

The diagram of FIG. 5 also shows an advantageous variant of the embodiment which consists of the possibility to adjust the phase shift value of each of the phase shift amplifiers by means of additional resistors RA which can be connected at will in parallel with the phase shift resistors R11, R12 and R21, R22 by means of transistors Tx which are of the MOS field effect type and play the role of switch.

For clarity a single additional resistor RA is shown in FIG. 5, connected in parallel with each phase shift resistor, but it is evident that one may easily provide various resistors which can be connected one by one or in groups via switch transistors which resistors receive each an appropriate switch command. This possibility is symbolized in the drawing Figure by the dashed extensions of the connections ending in the phase shift resistors.

For further details concerning the principle of image frequency rejection in a receiving apparatus one be referred to the article entitled "Microwave mixers" by S. A. MAAS, published by Artech House Inc., Norwoord, Mass., USA—1993—International Standard Book No. 089006-605-1, pp. 279 to 285, incorporated in this application by reference.

The invention is not restricted to the embodiments described hereinbefore. Firstly, a person skilled in the art will easily understand that, because of its simplicity, a cascoded arrangement is particularly suitable for effecting an amplification of the transimpedance type for the phase shift amplifier according to the invention, but that any other known arrangement carrying out the same function of a transimpedance type can be substituted therefore without a marked difference in the result.

On the other hand, the types of transistors used may be exchanged, more particularly, as regards the polarity and the bipolar type or field effect type. It will also be evident with respect to the cascoded stage formed by the transistors T3 and T4 of FIG. 1 or transistors T31, T32, T4, T42 of FIG. 5 that they have been described as being of the same type as the transistors of the differential input pair of the phase shift amplifiers. However, according to a variant (not shown), a cascoded stage called "folded stage" can also be used by replacing the transistors in question by transistors of opposite polarity, so that the load resistors are connected with one end to the reference voltage (earth), the emitters of these transistors being coupled, on the one hand, to nodes A, B (A', B') and, on the other hand, receiving a current from the supply voltage terminal Vcc via suitable current sources. Other modifications concerning the described examples, which are within grasp of the expert, remain, however, within the field of the invention as to be claimed hereinafter.

I claim:

1. A recombining circuit which includes a first and a second phase-shift amplifier which are configured to receive respective differential input signals which are phase shifted relative to each other, wherein each of the phase-shift amplifiers includes:

a differential pair of a first and a second transistor, a steady current source, transimpedance amplifier means for transforming a differential current into a differential voltage, a first and a second phase-shift resistor, a first and a second phase-shift capacitor, a first and a second load impedance, and a first and a second supply terminal, the steady current source being coupled between the first supply terminal and respective first main electrodes of the first and second resistor, the first and second phase-shift resistors being coupled between respective second main electrodes of the first and second transistors and a first and a second input terminal of the transimpedance amplifier means, respectively, the first phase-shift capacitor being coupled between the second main electrode of the first transistor and the second input terminal of the transimpedance amplifier means, and the second phase-shift capacitor being coupled between the second main electrode of the second transistor and the first input terminal of the transimpedance amplifier means, and the first and second load impedances being coupled between the second supply terminal and a first and a second output terminal of the transimpedance amplifier, respectively, wherein the differential current is produced at the first and second input terminals of transimpedance amplifier means, the differential current being phase-shifted relative to a differential input signal to be applied to respective control terminals of the first and second transistors, and wherein the differential voltage is an output voltage of the phase-shift amplifier, the recombining circuit further including a summation node at which the output voltages produced by the first and second phase-shift amplifiers are summed, to thereby produce a high impedance output voltage.

2. A transceiver station which includes a recombining circuit including a first and a second phase-shift amplifier which are configured to receive respective differential input signals which are phase shifted relative to each other, wherein each of the phase-shift amplifiers includes:

a differential pair of a first and a second transistor, a steady current source, transimpedance amplifier means for transforming a differential current into a differential voltage, a first and a second phase-shift resistor, a first and a second phase-shift capacitor, a first and a second load impedance, and a first and a second supply terminal, the steady current source being coupled between the first supply terminal and respective first main electrodes of the first and second resistor, the first and second phase-shift resistors being coupled between respective second main electrodes of the first and second transistors and a first and a second input terminal of the transimpedance amplifier means, respectively, the first phase-shift capacitor being coupled between the second main electrode of the first transistor and the second input terminal of the transimpedance amplifier means, and the second phase-shift capacitor being coupled between the second main electrode of the second transistor and the first input terminal of the transimpedance amplifier means, and the first and second load impedances being coupled between the second supply terminal and a first and a second output terminal of the transimpedance amplifier, respectively, wherein the differential current is produced at the first and second input terminals of the transimpedance amplifier means, the differential current being phase-shifted relative to a differential input signal to be applied to respective control terminals of the first and second transistors, and wherein the differential voltage is an output voltage of the phase-shift amplifier, the recombining circuit further including a summation node at which the output voltages produced by the first and second phase-shift amplifiers are summed, to thereby produce a high impedance output: voltage.

3. A phase-shift amplifier, including:

a differential pair of a first and a second transistor, a steady current source, transimpedance amplifier means for transforming a differential current into a differential voltage, a first and a second phase-shift resistor, a first and a second phase-shift capacitor, a first and a second load impedance, and a first and a second supply terminal, the steady current source being coupled between the first supply terminal and respective first main electrodes of the first and second resistor, the first and second phase-shift resistors being coupled between respective second main electrodes of the first and second transistors and a first and a second input terminal of the transimpedance amplifier means, respectively, the first phase-shift capacitor being coupled between the second main electrode of the first transistor and the second input terminal of the transimpedance amplifier means, and the second phase-shift capacitor being coupled between the second main electrode of the second transistor and the first input terminal of the transimpedance amplifier means, and the first and second load impedances being coupled between the second supply terminal and a first and a second output terminal of the transimpedance amplifier, respectively, wherein the differential current is produced at the first and second input terminals of the transimpedance amplifier means, the differential current being phase-shifted relative to a differential input signal to be applied to respective control terminals of the first and second transistors, and wherein the differential voltage is an output voltage of the phase-shift amplifier.

* * * * *